(12) United States Patent
Ma et al.

(10) Patent No.: US 6,899,553 B2
(45) Date of Patent: May 31, 2005

(54) ELECTRICAL CONNECTOR

(75) Inventors: Hao-Yun Ma, Tu-chen (TW);
Ming-Lun Szu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/894,751

(22) Filed: Jul. 19, 2004

(65) Prior Publication Data
US 2005/0014402 A1 Jan. 20, 2005

(30) Foreign Application Priority Data
Jul. 18, 2003 (TW) .............................. 92213176 U

(51) Int. Cl.$^7$ .......................................... H01R 13/44
(52) U.S. Cl. ..................... 439/135; 439/940; 439/41
(58) Field of Search ........................ 439/41, 135, 940, 439/901, 892

(56) References Cited

U.S. PATENT DOCUMENTS

| 5,163,837 | A | * | 11/1992 | Rowlette, Sr. ............... 439/91 |
| 6,155,848 | A | * | 12/2000 | Lin ............................. 439/135 |
| 6,655,970 | B2 | * | 12/2003 | Tsai ........................... 439/135 |
| 6,722,901 | B2 | * | 4/2004 | Kim et al. .................. 439/135 |

* cited by examiner

*Primary Examiner*—Tho D. Ta
(74) *Attorney, Agent, or Firm*—Wei Te Chung

(57) ABSTRACT

An electrical connector assembly includes an electrical connector and a pick-up cap for picking up the connector. The electrical connector electrically connecting a CPU package with a printed circuit board includes a housing defining an array of passageways with a plurality of electrical terminals accommodated therein and a load plate assembled with the housing. The pick-up cap has a receiving room close to the electrical connector and a plurality of latches adapted to attach the pick-up cap to the load plate. The receiving room is adapted to accommodate the extending portion of the CPU, thus escapes the pick-up cap from being removed during testing the connector and thereby provides enough protect for the electrical terminals.

9 Claims, 6 Drawing Sheets

ELECTRICAL CONNECTOR

BACKGROUND OF THE INVENTION

1. Field of the Invention

The present invention relates to the art of an electrical connector assembly, and particularly to an electrical connector assembly electrically connecting an electrical package such as a Central Processing Unit (CPU) package to an electrical substrate such as a printed circuit board.

2. Description of Prior Art

It's well known, a CPU package includes an Integrated Heat Spreader (IHS) stuck to a top surface of the CPU. The IHS protects the package's silicon chips from being scraped off when assembling heat sink thereon and conducts heat produced by the CPU to an outer heat sink. The IHS has an extending portion in the middle of it.

FIG. 6 shows a conventional electrical connector assembly 8 electrically connecting a CPU package 100 to a printed circuit board (not shown). The electrical connector assembly 8 comprises a connector 81 and a pick-up cap 90 for facilitating the assembly of the connector 8 with the printed circuit board. The connector 81 further comprises an insulative housing 82 having a plurality of terminals 811 accommodated therein, a stiffener 83 enclosing the housing 82, a load plate 84 pivoted to the stiffener 83, and a metal lever 85 for pressing the load plate 84. The terminals 811 extending out of the housing 82 are adapted to elastically engage with contacts of the CPU package 100. The pick-up cap 90 comprises a smooth plate for being picked up by an automatic device such as a vacuum nozzle and four latches 92 for fastening the pick-up cap 90 to the load plate 84 of the connector 81. With the pick-up cap 90 assembled thereon, the connector 81 can be picked up and placed on a corresponding position of the printed circuit board by a device.

Like all other electrical components, the connector 81 must pass a series of electric tests before being put into market. When testing the connector 81, the connector 81 needs to be connected to a test board, with a CPU package received in the connector 81. The electrical circuits through the CPU, the connector 81 and the board are adapted to test the electrical performance of the connector 81. On putting the CPU package into the connector 81, the pick-up cap 90 must be taken off to escape interfering with the extending portion of the CPU package. Therefore, during the period from test to end-user's use, the terminals 811 of the connector 81 are always extending out of the housing 82 and unprotected. Once damaged, the terminals 811 can't electrically connect the CPU and the printed circuit board perfectly.

A new electrical connector assembly that overcomes the above-mentioned problems is wanted.

SUMMARY OF THE INVENTION

An object of the present invention is to provide an electrical connector assembly electrically connecting a CPU package, which comprises a pick-up cap that can provide enough protection to terminals of the connector assembly even during the period from assembly to end-user's use.

In order to achieve the aforesaid object, an electrical connector assembly in accordance with a preferred embodiment of the present invention comprises a connector and a pick-up cap. The connector includes an insulative housing defining a plurality of passageways, a plurality of terminals received in the corresponding passageways, and a load plate attached to the housing. The pick-up cap defines a receiving space on a side near to the housing and four latches extending from the edge. The latches are adapted to fasten the pick-up cap to the connector. When testing the connector, the raised IDS of the CPU package can be received in the receiving space of the pick-up cap. As a result, the pick-up cap needn't be taken off during the test and it can protect the terminals of the connector from damage till end-users use it.

Other objects, advantages and novel features of the present invention will become more apparent from the following detailed description when taken in conjunction with the accompanying drawings, in which:

DESCRIPTION OF THE PREFERRED EMBODIMENT

Figure 1:
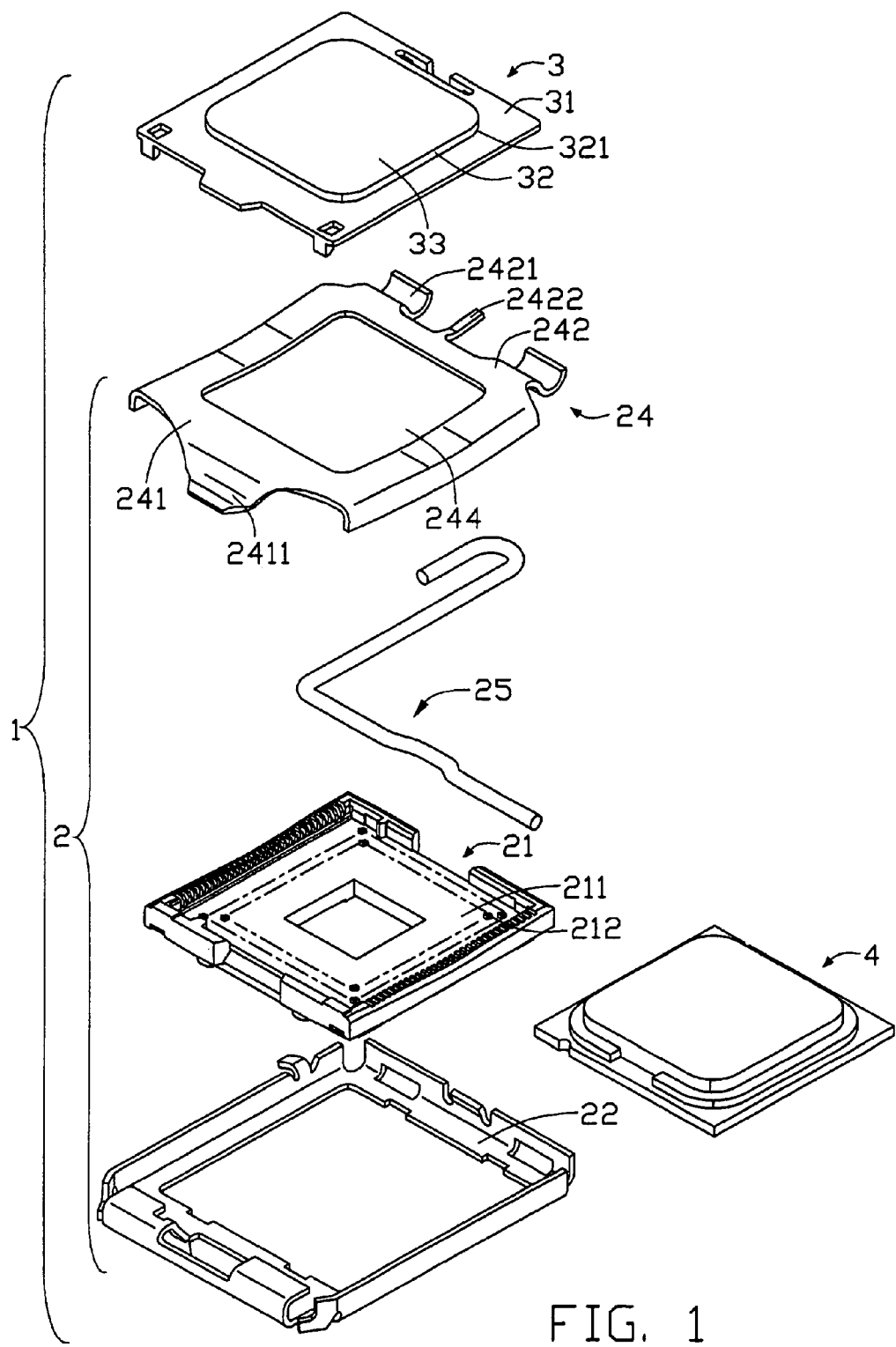
FIG. 1 is an exploded, isometric view of an electrical connector assembly in accordance with the present invention, together with a CPU package.
Figure 2:
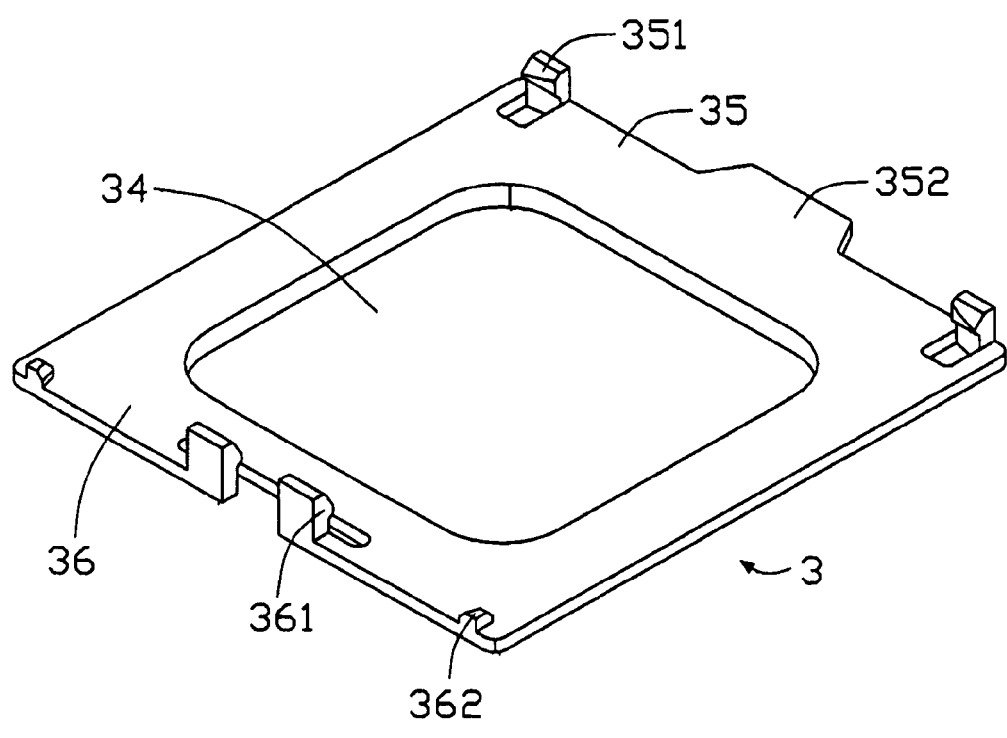
FIG. 2 is a bottom side view of the pick-up cap of the electrical connector assembly of FIG. 1.

Reference will now be made to the drawings to describe the present invention in detail.

Referring to FIGS. 1, 2, 3, 4 and 5, an electrical connector assembly 1 in accordance with the preferred embodiment of the present invention is adapted to electrically connect an electrical package such as a CPU package 4 and an electrical substrate such as a printed circuit board (not shown). The electrical connector assembly 1 includes an electrical connector 2 and a pick-up cap 3 assembled with the electrical connector 2. The connector 2 further includes an insulative housing 21 with a plurality of terminals 212 accommodated therein, a stiffener 22 enclosing the housing 21, a load plate 24 pivoted to the stiffener 22, and an actuator 25 in accompany with the load plate 24. The load plate 24 is adapted to press the CPU package 4 onto the terminals 212 and can be locked in this position by the actuator 25.

The housing 21 includes a rectangular board portion 211 and four sidewalls (not labeled) extended from each side of the board portion 211. A plurality of passageways (not labeled) are defined in the board portion 211, each of them receiving a corresponding terminal 212. One end of the terminal 212 extending out of the passageways is adapted to engage with contacts of the CPU package 4, and the other end is adapted to be soldered to the printed circuit board, as a result, the CPU package 4 is electrically connected to the printed circuit board by the terminals 212.

The load plate 24 comprises a first beam 241, a second beam 242 opposed to the first beam 241, and a pair of side beams (not labeled) interconnecting the first beam 241 and the second beam 242. An opening 244 is defined and surrounded by the four beams. A tongue 2411 and a positioning portion 2422 respectively extend outwards from middle portions of the first beam 241 and the second beam 242. As well, a pair of locking portions 2421 extends outwards from the second beam 242 symmetrically with respect to the positioning portion 2422.

The pick-up cap 3 includes a base board 31, a smooth plate 33 in parallel with the base board 31, and four sidewalls 32 connecting the board 31 and the plate 33. Some coins 321 defined between the walls are adapted to connecting each sidewall 32 smoothly. A receiving space 34 is defined by the plate 33 and the sidewalls 32, with one side open and acceptable. After the pick-up cap 3 is attached to the connector 1, the open side of the receiving space 34 is close to the connector 1. The board 31 comprise a first side 35, a second side 36 and cross sides (not labeled) connecting the first side 35 and the second side 36. An extending portion 352 extends outside from a middle portion of the first side 35, with its cross section appearing trapeziform. A pair of first latches 351 extends downwards from two opposite bottom of the first side 35 as well. The second side 36 defines a pair of second latches 361 extending downwards from the middle bottom and a pair of protruding portions 362 extending downwards from the side bottom.

Figure 3:
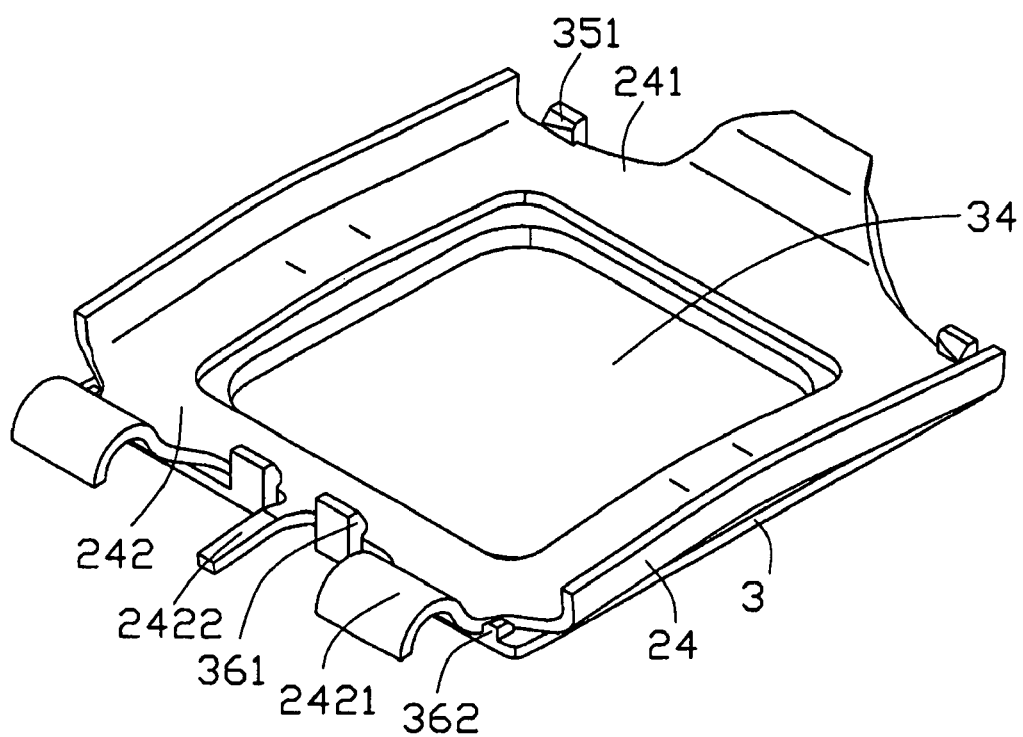
FIG. 3 is a bottom side view of the pick-up cap of FIG. 2 assembled with the load plate.

FIG. 3 is an isometric, bottom assembly view of the pick-up cap 3 and the load plate 24. When the pick-up cap 3 is assembled with the load plate 24, the first latches 351 are mated with the two distal edges of the first beam 241 of the load plate 24, at the same time the second latches 361 are mated with the edges of the second beam 242 with the positioning portion 2422 arranged therebetween. The protruding portions 362 are adapted to abut against the two distal edges of the second beam 242 to escape the pick-up cap 3 from sliding horizontally relative to the load plate 24. The extending portion 352 of the pick-up cap 3 is arranged above the tongue 2411 of the load plate 24. Because the extending portion 352 is substantially horizontal and the tongue 2411 extends downwards, a space is defined therebetween to facilitate the operation of taking away the pick-up cap 3.

When in assembly of the electrical connector 2 onto the printed circuit board, the pick-up cap 3 attached to the electrical connector 2 is picked up with a automatic device such as a vacuum nozzle together with the electrical connector 2. Then the electrical connector 2 can be placed onto an appropriate place and soldered to the printed circuit board.

A CPU Package 4 has an integrated heat spreader (not labeled) stuck to the CPU. The integrated heat spreader is adapted to protect the CPU from being destroyed and it has an extending portion 41 in the middle.

Figure 4:
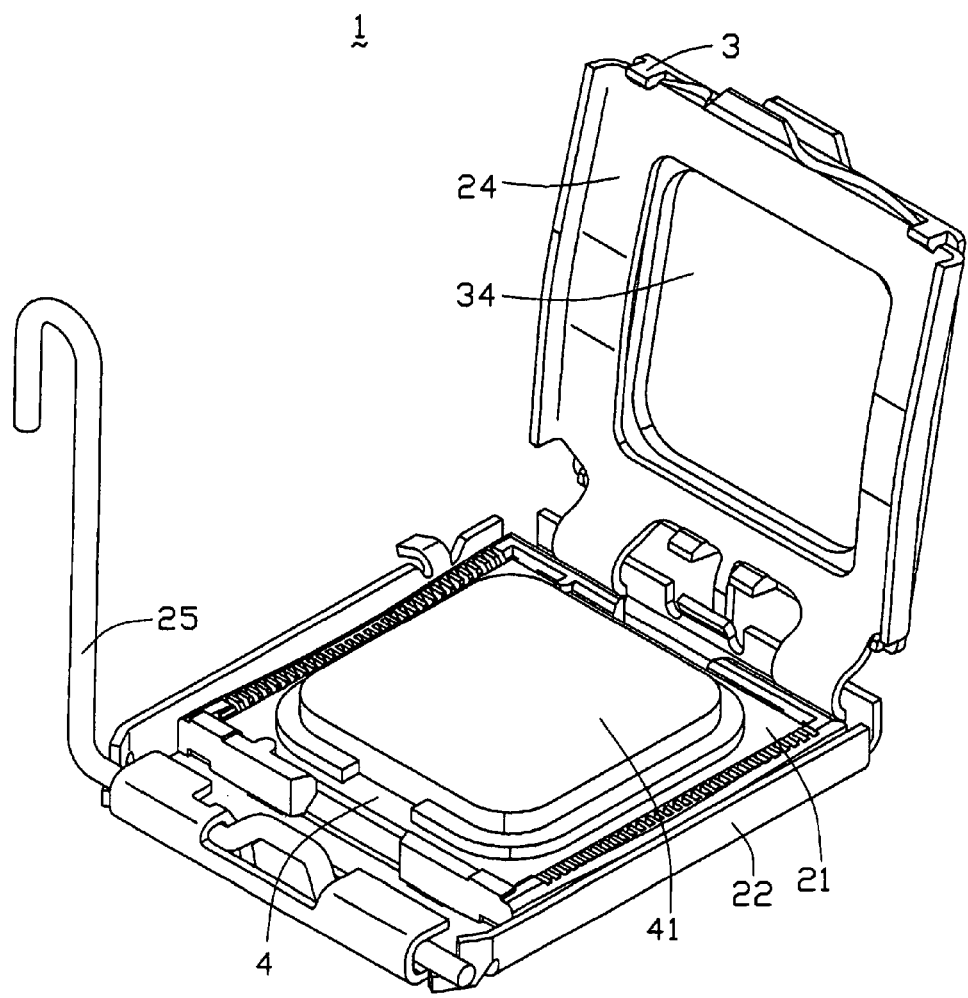
FIG. 4 is an isometric view of the electrical connector assembly of FIG. 1, showing the CPU package accommodated therein and the load plate open.
Figure 5:
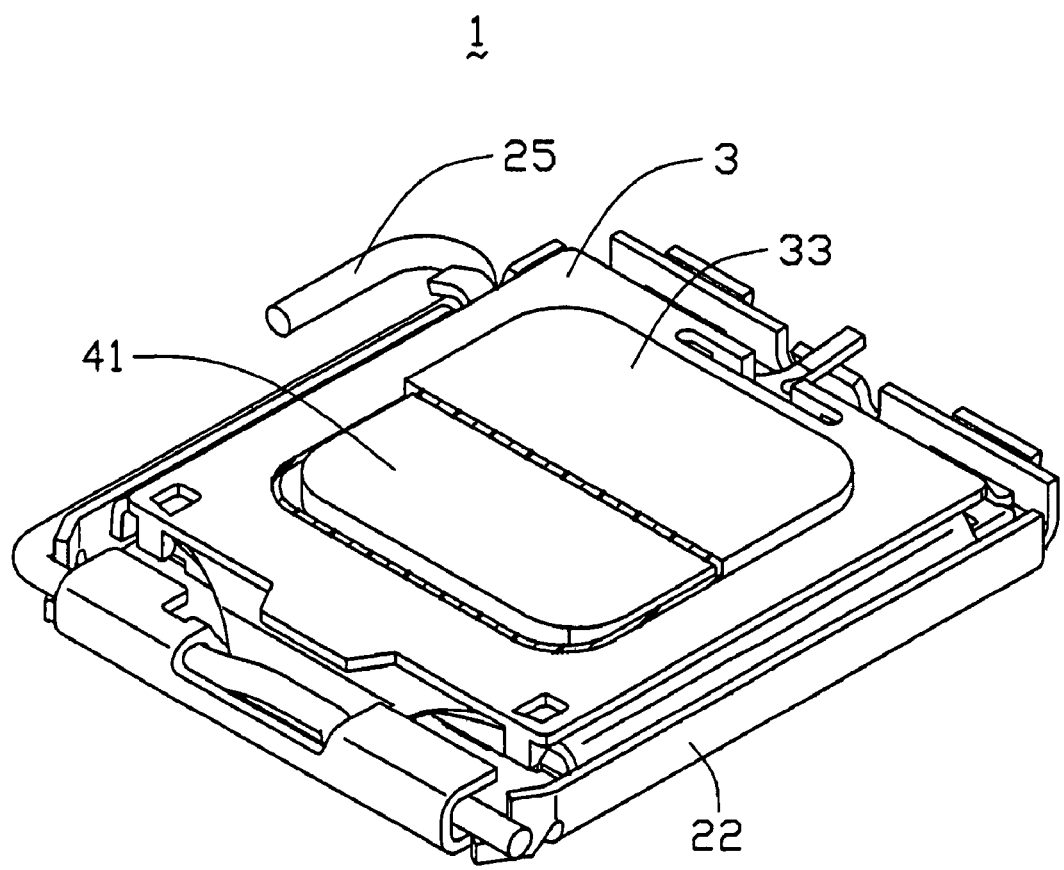
FIG. 5 is a partially cross-section view of the electrical connector assembly, showing a CPU package accommodated therein.
Figure 6:
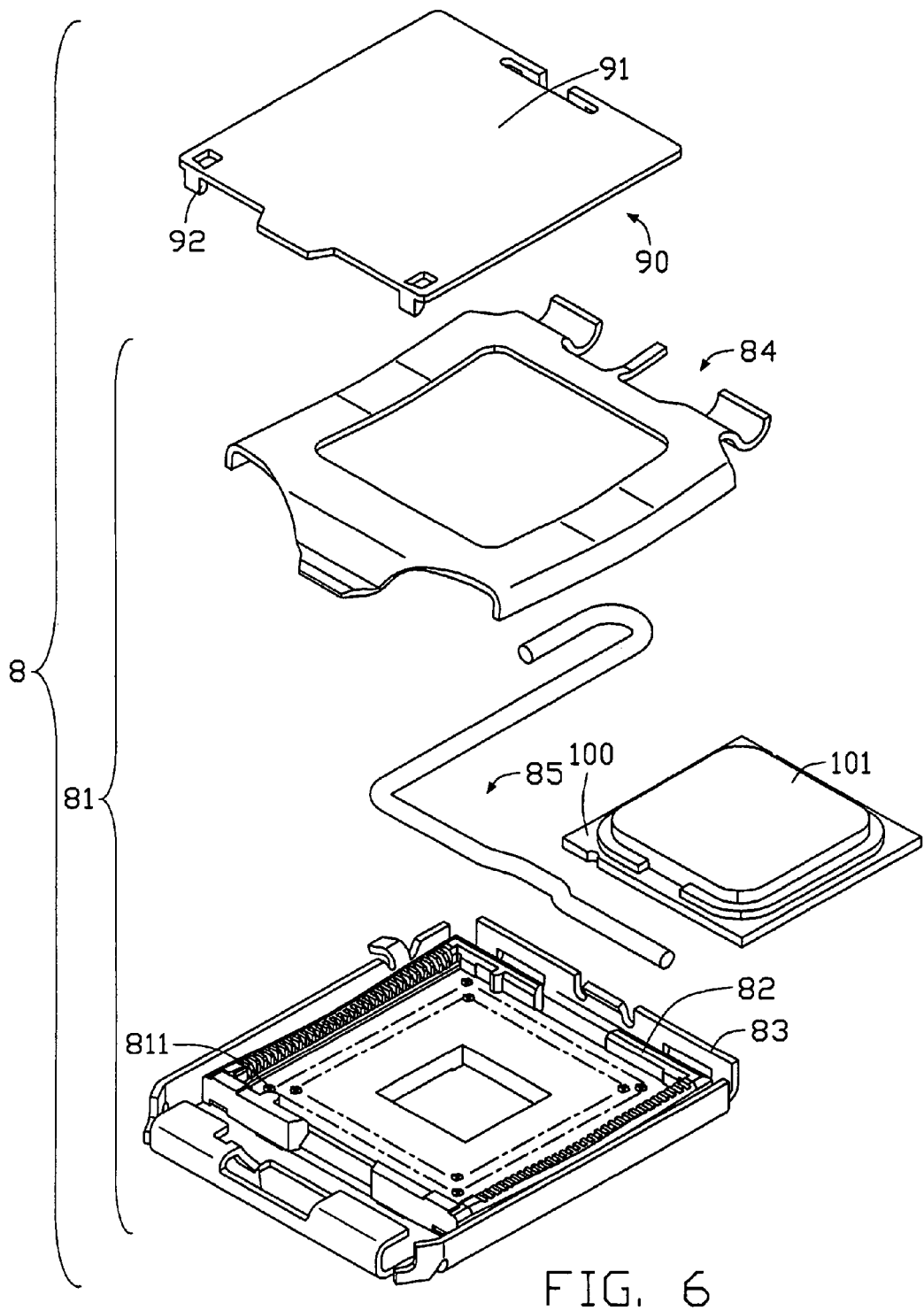
FIG. 6 is a exploded view of a conventional electrical connector related to the present invention, together with a CPU package.

When testing the electrical connector 2, firstly open the load plate 24 with the pick-up cap 3 attached thereto, secondly put the CPU Package 4 in the housing 21 with the contacts of the Package 4 in alignment with the terminals 212 respectively, as best seen from FIG. 4. Then close the plate 24 to press the Package 4 down to electrically connect with the connector 2. As best seen from FIG. 5, the extending portion 41 goes through the opening 244 of the plate 24 and is received in the space 34 defined by the plate 33 and the sidewalls 32.

After testing, take out of the CPU package 4, with the pick-up cap 3 still assembled with the connector 2. As a result, the pick-up cap needn't be taken away during the test and it can protect the terminals of the connector from damage till end-user uses it.

While a preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector assembly for electrically connecting an electrical package with an electrical substrate, comprising:
    an electrical connector comprising an insulative housing;
    a stiffener connected with the housing; and a load plate attached to the stiffener for pressing the electrical package into the housing; and
    a pick-up cap including a receiving space whose open side is proximal to the housing and a plurality of latches adapted to attach the pick-up cap to the connector;
    wherein the pick-up cap includes a board and a smooth plate in parallel with the board;
    wherein the plate and the board are connected by a plurality of sidewalls extending from the board;
    wherein the receiving space is within the sidewalls and a bottom of the plate.

2. The electrical connector assembly as claimed in claim 1, wherein the housing comprises a plurality of passageways with a plurality of electrical terminals accommodated therein.

3. An electrical connector assembly for electrically connecting a Central Processing Unit (CPU) package with a printed circuit board, comprising:
    an electrical connector comprising an insulative housing defining a plurality of cavities, a plurality of contacts received in the cavities, and a load plate for pressing the CPU package onto the contacts'; and
    a pick-up cap including a plurality of latches for locking the pick-up cap onto the connector and a smooth plate for being picked up by a device;
    wherein the pick-up cap includes a receiving space for receiving an extending portion of the CPU package;
    wherein the pick-up cap includes a board and sidewalls extending from the board as well;
    wherein the receiving space is surrounded by the sidewalls and a bottom of the smooth plate.

4. The electrical connector assembly as claimed in claim 3, wherein the receiving space is not completely close and accessible from at least one direction.

5. The electrical connector assembly as claimed in claim 3, wherein the connector further includes an actuator accompany with the load plate.

6. The electrical connector assembly as claimed in claim 3, wherein the latches extend down from a bottom of the board.

7. The electrical connector assembly as claimed in claim 3, wherein the surface and the board are connected by the sidewalls.

8. The electrical connector assembly as claimed in claim 3, wherein the connector further comprises a stiffener engaged with the housing.

9. An electrical connector assembly comprising:
    an electrical connector comprising an insulative housing;
    an electrical package seated upon the housing and defining an upwardly raised top portion; and
    a pick-up cap located above the housing to cover said electrical package, and including a raised receiving space so as to receive the top portion of the electrical package on an underside thereof and provide a flat upper surface for vacuum suction;
    wherein a load plate is located between the housing and the cap to press downwardly the electrical package toward the housing;
    wherein an opening is defined in the load plate in alignment with the raised receiving space so that the top portion of the electrical package extends therethrough to enter the raised receiving space.

* * * * *